United States Patent
Lim et al.

(10) Patent No.: US 9,477,791 B2
(45) Date of Patent: Oct. 25, 2016

(54) METHOD FOR DESIGNING CONTAINERS

(75) Inventors: Julie OiLun Lim, West Chester, OH (US); John Boyet Stevens, Mason, OH (US); James Dyess, Liberty, OH (US); Clint Adam Morrow, Union, KY (US); Jeffrey Todd Petach, Madeira, OH (US); Ryan Alan Klenke, Deerfield Township, OH (US)

(73) Assignee: The Procter & Gamble Company, Cincinnati, OH (US)

(*) Notice: Subject to any disclaimer, the term of this patent is extended or adjusted under 35 U.S.C. 154(b) by 1138 days.

(21) Appl. No.: 13/490,755

(22) Filed: Jun. 7, 2012

(65) Prior Publication Data

US 2013/0332117 A1 Dec. 12, 2013

(51) Int. Cl.
*G06G 7/48* (2006.01)
*G06F 17/50* (2006.01)

(52) U.S. Cl.
CPC ....... *G06F 17/5009* (2013.01); *G06F 17/5018* (2013.01)

(58) Field of Classification Search
CPC ................ G06F 17/5009; G06F 17/5018
USPC .................................................... 703/1, 2, 6
See application file for complete search history.

(56) References Cited

U.S. PATENT DOCUMENTS

| | | | |
|---|---|---|---|
| 7,366,643 B2* | 4/2008 | Verdura et al. | 703/1 |
| 2005/0211768 A1* | 9/2005 | Stillman | G07F 11/00 235/381 |
| 2006/0241791 A1* | 10/2006 | Pokorny | G05B 17/02 700/67 |
| 2011/0295563 A1* | 12/2011 | McDaniel | 703/1 |
| 2012/0253756 A1* | 10/2012 | Favier | 703/2 |
| 2012/0316839 A1* | 12/2012 | Looney et al. | 703/1 |

OTHER PUBLICATIONS

Kesari (Advanced container flow simulation for beverage lines, 2011 (29 pages)).*

* cited by examiner

*Primary Examiner* — Kandasamy Thangavelu
*Assistant Examiner* — Andre Pierre Louis
(74) *Attorney, Agent, or Firm* — David K Mattheis; James C Vago; Tara M Rosnell

(57) ABSTRACT

A method comprises steps of: providing an initial package design, providing an initial package-handling element design, modeling the interaction of the package and the package-handling element, and altering one of the package design or the package-handling element design according to the results of the model. Wherein the initial package-handling element design comprises at least one item selected from the group consisting of: a motion transfer component comprising a combination of discrete geometrically defined elements, package guide rails, package guide rail supports, vacuum conveying components, and combinations thereof. And wherein the interaction reflects the package interaction with the discrete elements of a multi-element motion transfer component or the package guide rails having a flexibility greater than zero, or package guide rail supports having a finite stiffness, or a combination thereof.

20 Claims, No Drawings

METHOD FOR DESIGNING CONTAINERS

FIELD OF THE INVENTION

The invention relates to computer-aided methods for designing containers. The invention relates particularly to computer-aided methods for designing packaging containers taking into consideration the interaction of the design of the container and one or more container-handling elements.

BACKGROUND OF THE INVENTION

The use of finite element analysis (FEA) in the design of packaging containers is known in the art. FEA has been used to simulate the interaction of containers as well as the interaction of containers and container handling system elements. Previous efforts have relied upon simplified specifications of each of the containers and the handling elements. The outputs of efforts utilizing such simplified or approximated specifications are themselves only approximations of reality.

Such outputs may be utilized to indicate trends or to suggest approximate performance levels but may not generally be relied upon as a substitute for the creation and evaluation of actual prototype packages and package handling systems. Prototyping packages is expensive and may limit the range of package designs which can be evaluated through actual package production. Package designers may be constrained in the design options that they are free to consider as budgets will not generally allow for extensive package prototyping.

Prototyping full packaging handling systems is more difficult and is not generally feasible due to time and cost constraints. Full systems must generally be used for production despite the discovery of less than acceptable design issues once actual use of the systems begins.

Once package and handling system designs have been finalized it is difficult and expensive to alter the designs. The exploration of "what if" package and system designs is limited when actual prototypes and/or handling systems are required for accurate evaluation of the scenario. Even if prototype packages are available, physical testing on an existing packing line may be impractical due to lost production time. What is desired is a more accurate method for simulating the interaction of proposed package designs with proposed package handling elements. What is desired are methods for evaluating package and system designs such that alternative designs may be accurately evaluated without the need for expensive actual prototypes and time-consuming physical testing. What is further desired are automated methods which may be rapidly set up and quickly processed without the need for high levels of computational sophistication on the part of the method user.

SUMMARY OF THE INVENTION

In one aspect the method comprises steps of: providing an initial package design, providing an initial package handling element design, the design comprising at least one item selected from the group consisting of: a motion transfer component comprising a combination of either discrete or continuous geometrically defined elements, package guide rails or other guide components, vacuum conveying components, guide component supports, rigid or flexible stop gate or packing line element that impedes, arrests, or otherwise accelerates or decelerates package/product motion, and combinations thereof; modeling the interaction of the package and the package handling element, wherein the interaction reflects the package interaction with the discrete elements of a multi-element motion transfer component or the package guide rails having a flexibility greater than zero, or package guide rail supports having a finite stiffness, or stop gate or accelerating or decelerating element or a combination thereof; and altering one of the package design or the package handling element design or process settings according to the results of the model. Further, the method comprises varying various model inputs through the ranges expected to be experienced in the package and packing line operating window; modeling the response envelope of the package and packing line to the varied input conditions; identifying an acceptable package and packing line response. Examples of model inputs include, but are not limited to: line speed, package spacing, package orientation, package geometry, package material thickness distribution, guide rail location, coefficient of friction between the package and packing line elements, package material behavior, vacuum level, package guide rail design and behavior, and design of motion transfer component.

DETAILED DESCRIPTION OF THE INVENTION

Methods for modeling the interaction of packaging containers and package handling system elements are described herein. The terms package and container as well as the combination packaging container are all intended to embody discrete items used for the purpose of providing marketable portions of consumer products. The terms further include both actual items such as boxes, bottles and cans which have been produced in a tangible form as well as virtual simulations or models of such items produced as meshes or as parameterized definitions for input to FEA software. The term design is intended to encompass all tangible and virtual forms relating to a particular envisioned form of package or package handling element.

In one embodiment, the method begins with a simulated (or modeled) package design associated with an actual package. The package may comprise an injection molded, extrusion blow molded, injection-, injection stretch- or other blow molded, thermoformed or otherwise constructed polymer container, a pouch or sachet constructed of polymer film layers, a blown glass container or an extruded and drawn metal container as well as composite containers, cardboard, products wrapped in thin polymer film or paper products. The modeled design may incorporate a model of the intended package contents and/or a package closure, spout, or other package component. The provided modeled design may originate from a computer aided engineering program or other computer based design program, or may be acquired by analyzing an actual package may be performed upon actual packages existing as production packages or as package prototypes to provide an measured description of the physical structure of the package elements including geometric form and material thickness distribution where applicable. Models sensitive to wall thickness variations benefit from the additional accuracy provided by such data. The wall thickness profile of the package may thus be determined from an actual package or may be virtually determined from a simulation of the manufacturing process proposed for fabricating the packages or a nominal description derived from the package design may be used as the basis for the FEA mesh used to describe the package. Example techniques for measuring package handling system component geometry, or package geometry and/or thickness profile include, but are not limited to: white light scanning, magnetic devices such as the Magna mike from Panametrics, dial caliper, micrometer, Micro CT, optical measurement devices, and digitizing scribe devices.

Empty Bottles/Cans/Canisters/Tubs—Empty bottles/cans/canisters/tubs may be simulated using shell elements to represent the thin-walled structure of the bottle/can/canister/tub.

Full (Liquid) Bottles/Cans/Canisters/Tubs—The full package may be modeled as either open or closed/sealed. The structure of the bottle/can/canister/tub may be represented with shell elements. The liquid in the bottle/can/canister/tub may simply be represented by any combination of lumped masses, springs, dampers, rigid links, and hydrostatic loads. Alternatively, the fluid may actually be modeled, e.g. using a finite element codes' ALE formulation or other method, or a coupled finite element/fluids formulation using two independent codes working against the same model (e.g. ABAQUS/Fluent).

Full (Powder/Solid) Bottles—The full package may be modeled as either open or closed/sealed. The structure of the bottle may be represented with shell elements. The solids in the bottle may simply be represented by any combination of lumped masses, springs, dampers, rigid links, and internal pressures. Alternatively, the solids may be modeled using either spherical particles, or continuum element formulations.

Soft, Highly Deformable Packages (e.g. Paper Towels, Tissue Paper), covered by thin polymer sheets—In one embodiment a relatively linear response may be assumed, meaning deformation modes of cardboard cores are not considered. A simple viscoelastic model that captures the bulk response of the polymer cover and soft product material may be used. In one embodiment, the core may be included if the core materials are properly characterized.

Soft Package Filled with Liquid (e.g. Stand-up Pouches)—The structure of the package may be represented by shells with minimal bending stiffness, or membrane elements. The liquid in the package may simply be represented by any combination of lumped masses, springs, dampers, rigid links, and hydrostatic loads. Alternatively, the fluid may actually be modeled, e.g. using finite element codes ALE formulation.

Soft Package Filled with Powder/Solid (e.g. Stand-up Pouches)—The structure of the package may be represented by shells with minimal bending stiffness, or membrane elements. The solids in the package may be simply represented by any combination of lumped masses, springs, dampers, rigid links, and internal pressures. Alternatively, the solids may be modeled using either spherical particles, or continuum element formulations.

Cartons Containing Powder/Solid (e.g. Laundry or Dish detergent)—The structure of the carton may be represented with shell elements. The solids in the bottle may simply be represented by any combination of lumped masses, springs, dampers, rigid links, and internal pressures. Alternatively, the solids may be modeled using either spherical particles, or continuum element formulations.

Cartons Containing any Product and/or Package—The structure of the carton may be represented with shell elements. If the carton contains a package or packages, the package can be represented by the methods described above for various package types. If the case contains a rigid product or products [e.g. molded product(s)], the product can be represented as a rigid shape with appropriate mass/inertia properties.

Corrugate Shipping Cases Containing any Product and/or Package—The structure of the corrugate can be represented on a layer-by-layer basis, or via bulk properties that smear of the individual layers (outer sheets and inner flutes). If the case contains a package or packages, the package can be represented by the methods described above for various package types. If the case contains a rigid product or products [e.g. molded product(s)], the product can be represented as a rigid shape with appropriate mass/inertia properties.

ALE, Arbitrary Lagrangian, Eulerian, refers to a modeling method wherein the analysis proceeds with a Lagrangian deformation step followed by mapping the resulting solution onto the original undeformed Eulerian mesh.

For perspective, in analyses conducted in a Lagrangian frame of reference, a material point in the media is attached to and deforms with the mesh representing the media. Conversely, in analyses conducted in an Eulerian frame of reference, a material point in the media is detached from and displaces through the mesh which is fixed in space. Analyses using the ALE method proceed using both Lagrangian and Eulerian frames of reference sequentially.

The simulations of the method may be performed using either implicit, explicit, or a hybrid implicit/explicit analysis. As used herein, explicit refers to an unconditionally numerically stable method provided the time step remains below a critical value associated with the time it takes a sound wave to pass through a single element. The sound wave speed is governed by the stiffness and density of the media. Explicit requires calculation of the effective stiffness matrix of the system only once at the beginning of the analysis. Explicit typically requires a very small time increment that remains constant throughout the analysis unless there is severe deformation. Using very small elements may cause the stable time increment to be very small and will dramatically reduce computational efficiency. Explicit may generally be used for short term dynamic or quasi-static events (up to 5 seconds event time) and may not be not favorable for analyses that require static equilibrium. Explicit may be generally favored for analyses with a lot of contact due to computational efficiency.

As used herein, implicit refers to analysis which may be conditionally numerically stable. Such analysis can be difficult to converge. Implicit requires calculation of the effective stiffness matrix at every increment. Each time step is more computationally expensive than the equivalent explicit analysis step but often bigger time steps may be taken than in an explicit analysis. Implicit requires a more skilled user to ensure analysis convergence particularly for dynamic analyses. In implicit analysis the time step varies over the course of the analysis and has no dependence on element size Implicit analysis may generally be used for analyses wherein static equilibrium is to be enforced, but may also be used for dynamic analyses (short event time), quasi-static analyses (time independent) and creep/viscoelastic analyses (long or short event time).

An implicit/explicit hybrid means any method that uses both Explicit and Implicit either sequentially or in parallel and for any part or whole of the domain of the model. For example the entire model may run n explicit time steps followed by n implicit time steps repeating over and over. As another example part of the model may always run in implicit while another part of the model may always run in explicit.

The properties of the package materials may be derived according to the nominal values associated with the intended materials or may be provided by evaluation of actual materials taken from fabricated packages. The viscoelastic properties of polymer materials may be evaluated and provided as model inputs. Additionally, model-to-physical experiment comparison of package impact loads, rebound velocity, impulse, impact event duration, and deformation responses may be used to calibrate and/or validate model parameters such as the viscoelastic, material model, contact parameters, damping parameters, coefficient of friction (COF) models, or other parameters in the FEA analysis.

In one embodiment, these physical measurements are made on a single bottle impact test wherein a bottle is conveyed at a known speed into a rigid stop gate equipped with a load cell to measure the impact load. High speed video is used to measure the dynamic response of the bottle, rebound velocity, impact compression deformation, event time, maximum bounce distance, minimum and maximum tilt angles. This validation test is conducted on a bottle sample that has been measured for both geometry and thickness profile measurement to accurately capture the actual package geometry in the associated validation model.

Simulated or actual testing allows the material properties to be determined at multiple locations throughout the package limited in resolution only by computing resources or real analytical capacity. Such simulated or actual testing provides material definition superior to the assumption that package materials have uniform behaviors throughout the different portions of the package.

In one embodiment, DMA, (Dynamic Mechanical Analysis), may be used to determine the mechanical response properties of polymeric materials. DMA is a material characterization method wherein the dynamic mechanical response of a polymeric sample can be measured either by applying a vibrational load and observing the spectral response or by applying a fixed displacement and observing the decay of load over time. These tests are conducted at various temperatures and are combined using time-temperature superposition to generate a master relaxation curve for the particular material. A viscoelastic model of polymer materials may be used to describe the package in the described method. In another embodiment, mechanical tests conducted at multiple strain rates may be used instead of DMA. These material characterization methods may be combined with the physical single bottle impact tests to accurately calibrate the system and drive higher model fidelity.

In one embodiment the physical data from measurements of real events and sub-events may be compared to the modeled results of the simulated version of these events. The relationship between the modeled results and the actual physical results may be used as a basis for altering at least one of the model parameters to reduce or eliminate differences between the modeled and actual results. This process may pass through a number of iterations until the fidelity of the model with regard to reality is achieved.

In one embodiment, data from actual product rebound tests may be used to tune the model with regard to the viscoelastic properties of the package. In one embodiment, data from actual tip angle measurements may be used to tune the model with regard to the coefficient of friction between a package and packing line components.

In one embodiment a simple conveying test using several filled bottles accumulated against a rigid stop gate equipped with a load cell may be used to calibrate the effective coefficient of friction between the bottle and the discrete or continuous conveying component (belt or chain). As the conveying component slides underneath the stationary accumulated bottles the load exerted on the stop gate can be used to determine the effective coefficient of friction for a given conveying component. The conveying chain velocity and the weight of the filled bottles can be varied to capture the dependence of friction on the relative slip rate and contact pressure.

In one embodiment the model may be validated utilizing real data associated with events and sub-events to calibrate the model. As an example, the impact of a four package train with a stop gate may be broken down into a series of events and sub-events. The four bottle collision may be examined as the collision of the initial package and the subsequent collision of each remaining package. The initial collision may be further examined as the sub-events of the initial approach to the gate, the impact, the deformation of the package, leaving the gate, rebounding from the gate, and so on. The real and virtual events and sub-events may be compared using forces on the packages and the gate, displacements, velocities, package compression, and impulses. The gate forces, rebound velocity, impact event time, package compression and impulse may be used to calibrate the material response while the first bounce-back and package tilt angles may be used to calibrate the friction representation. Building and calibrating the model at this level results in a more accurate output when the additional complexities of the entire four package train colliding with the gate (or other more complex conveying scenario) are added to the simulation.

High-speed, multiple camera video may be used in conjunction with motion analysis software to acquire data for validating the model. The motion analysis software provides data associated with bounce-back distance, compression, rebound velocity, package location versus time in the event, min/max package tilt angles, and package rotations, enabling rapid validation and tuning of the developed models. Load cells data from actual package interaction may be used in conjunction with the video data to determine package impulse and momentum changes.

The model may be developed using empirical values for the coefficients of friction (COF) between packages themselves, packages and guide rails, gates and conveying chains for representative materials. The user interface may allow the user to accept the automatically populated values for the respective COFs or may provide the option of user provided COFs.

The modeling of the interaction of multiple packages may be simplified by the utilization of a full FEA mesh for only the lead bottles in a train and the use of a coarse or otherwise simplified representation for the remaining packages to obtain the load on lead bottles. The load from the simplified model may them be used as input to a fully deformable, finely meshed sub-model of the lead bottle(s), including the effects of viscoelasticity so the analysis can capture the effects of surge hold time on bottle denting. This approach will reduce the necessary computing resources and/or the necessary time to resolve the model in relation to the time to solve an approach that models all bottles in the surge condition as fully flexible and filled with fluid.

In one embodiment, the simulated package-handling system is used together with a coarse representation of the simulated package to determine the load on the first package in a multi-package chain. The chain may contain a substantial number of rigid representations of the package. This simulation may be used to calculate the load upon the package, or packages at the front end of the chain. This calculated load may then be applied to a fine mesh simulation of the package to determine the effect such a load would have upon the package.

The simulation utilizing the fine mesh may also incorporate a viscoelastic material model of the package polymer such that it is possible to determine if the load upon the package will result in material creep and/or permanent denting of the package. The modeling of fluid filled packages may be simplified by representing the fluid and the package head space in a simplified form. The model of the filled package may consider the pressure within the package relative to the external pressure. The relative pressure may be modeled as positive, negative or essentially equal to the external pressure. Exemplary simplifications include representing the fluid filled spaces of cases of full packages as an air bag in LS-Dyna, or as a "fluid cavity" in ABAQUS, available from Dassault Systemes, Waltham, Mass. These simplifications adequately represent the hydrostatic behavior of the fluid without unnecessarily increasing computational requirements. For individual package modeling, an ALE representation of the fluid may be used to capture the inertial loading of the package arising from the fluid contents.

The interaction of package with vacuum systems may be simplified through the development of an empirical model from experimental data relating package pull off force to the package base geometry, the conveyor chain geometry, number and geometry of the orifices in the links, and the vacuum level. Data collected across a range of packages/conveyor chains, and vacuum levels may be used to derive an empirical relationship to predict the dynamic pressure on the package.

Vacuum loads can be modeled as a dynamic pressure on the package rather than using fluid-structure techniques. These pressure loads may be a function of bottle location relative to vacuum sources, and may be applied to a layer of null shell elements associated with the footprint of the bottle. For example, these vacuum sources may be holes in the vacuum chain or gaps between discrete vacuum chain links.

Null shells refer to shell elements with no stiffness. They may be attached to structural elements in the model via rigid constraints to transmit loads.

The methods of the invention may be provided as coded instructions for use with a computer. The instructions may be provided as stored information on a hard drive of a computer or stored upon computer readable media such as removable disks or solid-state memory.

In one embodiment, a Graphical User Interface (GUI) provides a means for a user to interact with and utilize the method of the invention.

The methods of the invention may be practiced on appropriately configured computational platforms. The platforms supported include personal computers and large-scale personal computer-based scientific computing clusters.

The methods may be utilized to evaluate how package stability during handling is impacted by gate geometry, including gate contact angle and gate shape; the package orientation during handling for asymmetric packages; the timing of package handling chains, the materials comprising package handling chains; the effects of package center-of-gravity upon stability; and the stability effects of different package materials.

Once a particular model has been sufficiently validated to achieve the desired fidelity the model may be used in the evaluation of new and/or existing packages and package handling systems not specifically simulated in the development of the model. Use of the model to simulate new and/or existing packages, packing system elements, and packing systems may yield results which fail to adequately correlate with subsequently observed real interactions. Additional real interactions may be measured and used to alter model parameters in additional validation steps to expand the utility of the model to include the new and/or existing packages and packing system or system elements.

As packages may be asymmetrical with regard to their vertical or other axes, the method enables the virtual testing of package handling with respect to package orientation and the determination of orientation driven effects in the handling system. This information may be used to alter either the package design or the handling system. The system may be altered to either re-orient the packages to reduce the effects or the system may be altered to accommodate a necessary package orientation while also reducing the severity or frequency of the effect or both. The package design may be altered to modify the wall thickness profile of the package and thereby alter the center of gravity of the package. The package shape may also be altered in response to issues revealed via the simulation relating to the interaction between the bottom of the package and the conveying system or between the package and guide rails or stop gate.

In one embodiment the model of the package handling system may be configured by a system user to match or approximate portions or all of an intended or actual handling system. In some instances, new and/or existing packages are filled and otherwise handled using systems which are largely already in existence. In these instances, determining the interaction of the package with the system prior to implementation of the new package may allow changes to be made to the package design, the handling system, process settings, or combinations thereof.

The layout or routing of the simulated handling system may be defined by the user by selecting a combination of standard conveying elements and configuring the elements to match either an actual or envisioned system. Conveying elements including, but not limited to, inclines, declines, offsets, curves, and transition plates may be provided as predefined scripts allowing a user to select and combine elements to configure a system for modeling. The configuration and definition of the respective elements may be altered as desired to enable the virtual testing of different configurations in terms of conveying system layout, conveying system chain type, conveyor speeds, and package rail or guide component design including associated component flexibility and dimensions. Transitions in the simulation between specified elements may also include the specification of part birth and death components wherein elements are part of the computations only during the time frame of interaction with the package and are not considered or part of the computation prior, or subsequent to the interaction. A graphical user interface (GUI) may be created to facilitate the definition of the layout by a user of the method. The GUI may include one or more menus comprising options associated with defining the layput or routing.

Packages, guide rails, guide rail supports, conveying chain, and the conveyor path elements may each be specified by a user and may also be selected from ranges of predefined software scripts for each of these items, again diminishing the level of expertise necessary to utilize the modeling method.

The use of predefined scripts enables the specification of conveying system paths which reflect actual systems rather than limiting the model to a single predefined conveying path. This enables the user to specify the range of interactions between the packages and the system more realistically.

The user may specify the inputs and initial conditions of the system as ranges thereby enabling a more complete model of possible scenarios and outcomes. Exemplary inputs and conditions such as line speed, package spacing, package orientation, package material thickness distribution, guide rail location, coefficient of friction between the package and packing line elements, package material behavior, package guide rail design and behavior, and design of motion transfer component may be specified using ranges. Examples of ranges are shown below:

| Inputs | Condition Ranges |
| --- | --- |
| Bottle spacing | 20 mm-150 mm |
| Bottle orientation | All packages left facing, all packages right facing, packages alternative left and right facing |
| Chain | Rexnord 820-314, Rexnord 880-314, Rexnord 880-412 |
| Rail Type | Flexlink XLRS, Solus VGA2520, System Plast |
| Rail Location | Lower rail height: 30 mm-50 mm Upper rail height: 90 mm-120 mm |
| Package Material | Various polymer types |
| Friction Coefficients | Package to chain COF: .1-.25 |
| Line Speed | 300-1400 mm/s |

The approach to evaluate the performance of a package and packing line over a range of conditions is as follows: First, the desired inputs and condition ranges are determined Second, the virtual experiment is designed choosing from many of the various design of experiment techniques based on the desired need. Third, the models are executed using the inputs and conditions determined by the design of experiments. Fourth, the desired response variable (e.g. rocking angle, angle of rotation, etc.) is captured and measured. Fifth, a statistical evaluation of the test results is conducted. Sixth, an acceptable package and/or packing line response is identified.

A package and/or packaging line response may be considered acceptable when performance associated with it satisfies threshold performance requirements. An acceptable performance level may or may not be an optimal performance level. The method may be iterated to identify an optimal package and/or packing line response.

In one embodiment, the method may be carried out using single values for the model inputs rather than varying these values within defined ranges. In this embodiment, the output of the model may indicate that a particular package and/or packing line configuration is acceptable or unacceptable. In this embodiment, the results of the model may be used to support a decision to move forward with a particular package design and/or packing line design.

Isight from Dassault Systemes, of Vélizy-Villacoublay, France may be used to automate the work flow of varying the model inputs as specified, managing the execution of the simulations, and post processing the results. However, any number of simulation work flow management software can be used. Statistical analysis of the results may be conducted using statistical software such as JMP, available from the S.A.S. Insititue, Inc., of Cary, N.C., USA.

In defining the handling system for the method, the accuracy of specification used may significantly impact the fidelity and usefulness of the model outputs. In one embodiment handling elements including polymer or metal package-contacting chains or belts may be defined as a plurality of interconnected and interacting discrete elements rather than as a uniform continuous element.

In one embodiment, the geometry of common chain link elements may be provided as menu options for a user to select thereby reducing the user sophistication level necessary to utilize the modeling system and method. The modeled interaction of packages with defined individual conveyor chain links, each in turn modeled to the extent of having its own displacement versus time curve as the simulation of the interaction proceeds, yields results which provide an measured depiction of real system interactions.

In one embodiment, the method determines the placement of chain links for the modeled interaction. In this embodiment, the sample code performs the following functions:
Determine what type of load case is requested:
  If the loadcase is Gate Impact or Side Shift, the chains move in a straight path (birth and death times for chain motion are not necessary)
  All other load cases have non-straight chain paths; the birth and death times for chain motion are necessary
Verify that an analytical plate has not been requested as the chain type; if it has been requested, then the following code is skipped
Loop through each degree of freedom (DOF): x, y, z, rx, ry, rz
  If the DOF is x, reference the straight load curve for initial motion
  Otherwise, reference the stationary load curve for initial motion
  Loop through all chain links
    Write out load curves for initial motion (displacement from their initial position to the origin)
    If the chain path is not straight:
      Write out the death time for each chain link; the death time is the time at which the link reaches the initial position of the first chain link
      Write out load curves for motion beyond the origin and corresponding birth time; the birth time is the same as the death time for each chain link The method also comprises modeling package guide rails. There are many different manufacturers, materials, and shapes for conveyor guide rails. An exemplary manufacturer of guide rails is Solus Industrial Innovations, LLC, of Florence, K.Y., USA. Guide rails may be as simple as a series of round stainless steel rods that guide the package, and as complex as many-component assemblies. In general, for individual bottle conveying, guide rails are designed to guide the bottle while imposing minimal friction forces that oppose bottle motion. To minimize friction, metal guide rails may be covered with sleeves made of low friction polymers.

In one embodiment handling system guide rails may simplistically be defined as infinitely rigid or as having zero flexibility. As actual guide rails lack such infinite rigidity, the use of the simplified definition tends to introduce inaccuracies into the model outputs reducing the value of the results. Alternatively, guide rails may be modeled using beam elements to capture structural response, with the beam elements connected to null shell elements used in contact definitions with other model structures. In one embodiment the flexibility of actual handling system guide rails has been experimentally determined and used to define the flexibility of simulated guide rails. Using experimentally determined rail stiffness in combination with the beam element approach eliminates the need to determine accurate material properties of the rail materials which would be needed for a solid element representation. System users may select the number of package guide rail geometries and spatial positions from system menus when defining the simulated handling system.

In one embodiment, the model determines a rail path or set of rail paths. The rail paths are created based on the chain path input by the user and the 2-D user inputs locating the guide rails in space (defining rail widths and height). To obtain the rail paths, the radii of the given chain path need to be changed anytime a non-straight Chain path exists.

The code performs the following functions:
Determine if the rail path will differ from the chain path
If the loadcase is "Gate Impact", then both the chains and guide rails travel in a straight line. In this case, the rail path and chain path are the same and no adjustments are necessary.
All other load cases have non-straight chain paths. This requires adjustment of the radii for the rail paths based on their positions in space relative to the chain path, and based on the turn direction (horizontal or vertical).
If needed, adjust chain path radii to obtain each individual rail path by looping over all sections of the chain path and looping over all guide rails
Determine turn direction for the current path section
If the turn is vertical, offset the rail turning radius by the product of the rail's height and the sign (positive or negative) of the turning angle
Relative to the chain path radius, the rail radius will increase with any downward turn and decrease with any upward turn
If the turn is horizontal, offset the rail turning radius by the product of the rail's horizontal distance from the centerline and the sign (positive or negative) of the turning angle
Relative to the chain path radius, the rail radius for a "left rail" will decrease with a left turn and increase for a right turn
Relative to the chain path radius, the rail radius for a "right rail" will increase with a left turn and decrease for a right turn In one embodiment guide rail supports may be modeled as well as the guide rails themselves. Actual guide rails have finite stiffness and may allow the guide rails to flex under package loading. The guide rail supports may be modeled as simplified structures which may include beam elements, springs and dashpots without the need to specify the full support geometry, exact support materials and accompanying properties. Representing the guide rail supports with simplified structures provides the advantage of fewer elements and faster model solve times. Representative guide rail supports may be evaluated experimentally under actual loading conditions to determine their response to loading. This response may then be used to develop the simplified structures associated with different support designs. A user may select the number, geometry, and spatial position of guide rail supports from a range of representative designs.

Measured definitions of the guide rails and guide rail supports enable accurate modeling of package surge loading and enable the user to predict the behavior of the package design under differing conveyor population loading levels. As an example, a package conveyor may have package guide rails spaced at a particular distance to control the orientation of the packages and to prevent adjacent packages from becoming cam-locked, or shingled, in combination with the conveyor package guide rails. Such cam-locking or shingling is the result of package combinations interacting with each other and with external contact surfaces, (the package guide rails) such that the set of inter-package and package-rail contact points operates as a set of cams or wedges resulting in the set of packages resisting the forward motion of the conveyor chain. Such shingling may result in damage to the packages and/or guide rails and may impede the smooth operation of the handling system and the accompanying unit operations. The conveying system filled with packages with the package conveying chain continuing to run beneath the bottles may subject the package guide rails to sufficient stress that the guide rails will flex and will therefore alter the effective width of the conveyor enabling packages to interact, nest, or 'shingle' in undesirable ways. Failing to provide for the possibility of such rail flexing can lead to simulation results which are overly optimistic with regard to the package handling efficiency of the modeled system as the results lack an adequate model of package shingling possibilities. Using beams and null shells to model the guide rails provides the additional benefit of utilizing fewer elements than a solid mesh of the guide rails would require, thus reducing the time required for resolving the model.

The modeling methods described herein may be applied to creating and using models of the interaction between objects and associated object handling and transforming equipment. The methods may be used to model the interaction of rigid or non-rigid packages and/or products; or, components of packages or products with handling or converting equipment. Exemplary interactions include, without being limiting: equipment for breaking down a unit load of packages or products, object filling, capping, labeling, packing and unit load forming equipment; product or package handling and transformation equipment, unit load stabilization equipment; warehousing and shipping equipment.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm"

Every document cited herein, including any cross referenced or related patent or application, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. Method for designing packages and package handling systems, the method comprising:
  a. providing a computer aided design (CAD) model of an initial simulated package design,
  b. providing a CAD model of an initial simulated package-handling element design, the design comprising at least one item selected from the group consisting of: a motion transfer component comprising a combination of discrete geometrically defined elements, package guide rail assemblies, stop gates, vacuum conveying elements and combinations thereof;
  c. modeling the interaction of the simulated package(s) and the simulated package-handling element using a finite element (FE) analysis method, wherein the interaction reflects the package interaction with the discrete elements of a multi-element motion transfer component or the package guide rail assemblies having a flexibility greater than zero or a stop gate, or a vacuum conveying element or a combination thereof, wherein modeling interaction of the simulated package(s) and the simulated package-handling element includes using conveying test data to predict the dynamic pressure on the simulated package, wherein the conveyance test involves one or more filled bottles accumulated against a rigid stop gate equipped with a load cell to calibrate effective coefficient of friction between the one or more filled bottles and discrete or continuous conveying components;

d. validating the modeled interaction using measured data from real events and sub-events of actual interaction; and e. altering or accepting at least one of the simulated package design or the simulated package-handling element design or packing line process settings according to the results of the modeling to guide one or more bottles during a packing process while imposing minimal friction that oppose motion on the one or more bottles.

2. The method according to claim 1 wherein the step of providing a simulated package handling element comprises providing at least one of: measured geometric descriptions of individual conveying chain elements, conveyor guide rail elements, and stop gate elements.

3. The method according to claim 1 further comprising the step of modeling conveyor guide rails as beams and null shells.

4. The method according to claim 1 further comprising the step of modeling conveyor guide rail supports as a combination of beams, springs and dash-pots.

5. The method according to claim 1 further comprising the step of describing the package using a viscoelastic material model based upon Dynamic Mechanical Analysis (DMA) testing of materials or multiple strain rate material testing.

6. The method according to claim 1 further comprising the step of allowing a method user to define the conveying system layout and elements.

7. The method according to claim 1 further comprising the step of modeling the motion of discrete conveyor links using individualized displacement versus time curves.

8. The method according to claim 1 further comprising the step of specifying original model conditions via ranges.

9. The method according to claim 1 further comprising the step of using explicit, implicit, implicit dynamic, or implicit/explicit hybrid finite element analysis.

10. The method according to claim 1 wherein the step of providing an initial simulated package design comprises providing a design incorporating at least one of: data from geometry and thickness profile measurement of a package.

11. The method according to claim 1 wherein modeling the vacuum conveying element comprises applying a dynamic pressure to the package.

12. Method for designing packages and package handling systems, the method comprising:
a. providing a computer aided design (CAD) model of an initial simulated package design,
b. providing a CAD model of an initial simulated package handling element design, the design comprising at least one item selected from the group consisting of: motion transfer components comprising a combination of continuous or discrete geometrically defined elements, package guide rail assemblies, stop gates, vacuum conveying elements and combinations thereof;
c. providing measured geometric descriptions of individual conveying chain elements, conveyor guide rail elements, stop gate elements, vacuum conveying elements, and packages;
d. modeling interaction of the simulated package and the simulated package handling element using a finite element (FE) analysis method, wherein the interaction reflects the package interaction with the discrete elements of a multi-element motion transfer component or the package guide rail assemblies having a flexibility greater than zero or a stop gate, or a vacuum conveying element, or a combination thereof, wherein modeling interaction of the simulated package(s) and the simulated package-handling element includes using conveying test data to predict the dynamic pressure on the simulated package, wherein the conveyance test involves one or more filled bottles accumulated against a rigid stop gate equipped with a load cell to calibrate effective coefficient of friction between the one or more filled bottles and discrete or continuous conveying components;
e. validating the modeled interaction using measured data from real events and sub-events of actual interaction; and
f. altering or accepting at least one of the simulated package design or the simulated package-handling element design or packing line process settings according to the results of the modeling to guide one or more bottles during a packing process while imposing minimal friction that oppose motion on the one or more bottles.

13. The method according to claim 12 further comprising the step of modeling conveyor guide rails as beams and null shells.

14. The method according to claim 12 further comprising the step of modeling conveyor guide rail supports as a combination of beams, springs and dash-pots.

15. The method according to claim 12 further comprising the step of describing the package using a viscoelastic material model based upon Dynamic Mechanical Analysis (DMA) testing of materials or multiple strain rate material testing.

16. The method according to claim 12 further comprising the step of modeling the motion of discrete conveyor links using individualized displacement versus time curves.

17. The method according to claim 12 further comprising the step of using explicit, implicit, implicit dynamic, or implicit/explicit hybrid finite element analysis.

18. The method according to claim 12 further comprising the step of allowing a method user to define the conveying system layout and elements.

19. The method according to claim 12 further comprising the step of specifying original model conditions via ranges.

20. The method according to claim 12 wherein modeling the vacuum conveying element comprises applying a dynamic pressure to the package.

* * * * *